United States Patent
Tsuruda et al.

(10) Patent No.: US 11,461,885 B2
(45) Date of Patent: Oct. 4, 2022

(54) SUBSTRATE INSPECTION METHOD, SUBSTRATE INSPECTION SYSTEM, AND CONTROL APPARATUS

(71) Applicant: Tokyo Electron Limited, Tokyo (JP)

(72) Inventors: Toyohisa Tsuruda, Koshi (JP); Hiroshi Tomita, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 306 days.

(21) Appl. No.: 16/887,039

(22) Filed: May 29, 2020

(65) Prior Publication Data

US 2020/0388025 A1 Dec. 10, 2020

(30) Foreign Application Priority Data

Jun. 5, 2019 (JP) .............................. JP2019-105557

(51) Int. Cl.
*G06T 7/60* (2017.01)
*G06T 7/00* (2017.01)

(52) U.S. Cl.
CPC .............. *G06T 7/0004* (2013.01); *G06T 7/60* (2013.01); *G06T 2207/30148* (2013.01)

(58) Field of Classification Search
CPC ...................... G06T 7/0004; G06T 7/60; G06T 2207/30148; H01L 21/00; H01L 22/12; H01L 22/20; H01L 21/67253; G01B 11/0616; G01B 11/02; G01B 11/08
USPC ............................ 382/100, 145, 190; 438/62
See application file for complete search history.

(56) References Cited

U.S. PATENT DOCUMENTS

| | | | | |
|---|---|---|---|---|
| 5,940,175 A | * | 8/1999 | Sun | G01N 21/9501 356/237.3 |
| 6,313,903 B1 | * | 11/2001 | Ogata | H01L 21/67253 396/311 |
| 6,987,874 B2 | * | 1/2006 | Hirose | G06T 7/0004 700/110 |
| 8,796,048 B1 | * | 8/2014 | Thompson | H01L 22/12 438/638 |
| 2002/0009658 A1 | * | 1/2002 | Sato | H01L 21/67178 430/30 |
| 2004/0196031 A1 | * | 10/2004 | Nagano | H01L 22/20 257/E21.585 |

(Continued)

FOREIGN PATENT DOCUMENTS

JP      2015-215193 A      12/2015

*Primary Examiner* — Sheela C Chawan
(74) *Attorney, Agent, or Firm* — Posz Law Group, PLC

(57) ABSTRACT

A method of inspecting a substrate, includes: creating a model indicating a relation between a pixel value in a captured image of the substrate and a feature amount of a film on the substrate, based on a measured feature amount of a film on a creating substrate and a captured image generated by imaging the creating substrate by an apparatus in a first system; imaging an object substrate by an apparatus in a second system to generate a captured image, and calculating an estimated feature amount of a film on the object substrate, based on the captured image and the model; calculating a statistical value of the estimated feature amounts of the object substrates; and calculating an offset amount for the estimated feature amount from a measured feature amount of a film formed by performing a same treatment on an offset substrate in the second system and the statistical value.

14 Claims, 7 Drawing Sheets

(56) References Cited

U.S. PATENT DOCUMENTS

| | | | |
|---|---|---|---|
| 2005/0179910 A1* | 8/2005 | Bartov | G06T 7/0004 |
| | | | 382/145 |
| 2006/0192973 A1* | 8/2006 | Aiyer | G01B 11/0641 |
| | | | 356/487 |
| 2011/0205556 A1* | 8/2011 | Sakai | G01B 11/0625 |
| | | | 356/630 |
| 2015/0324970 A1* | 11/2015 | Iwanaga | G06T 7/60 |
| | | | 382/145 |

\* cited by examiner

SUBSTRATE INSPECTION METHOD, SUBSTRATE INSPECTION SYSTEM, AND CONTROL APPARATUS

CROSS REFERENCE TO RELATED APPLICATIONS

This application is based upon and claims the benefit of priority of the prior Japanese Patent Application No. 2019-105557, filed in Japan on Jun. 5, 2019, the entire contents of which are incorporated herein by reference.

TECHNICAL FIELD

This disclosure relates to a substrate inspection method, a substrate inspection system, and a control apparatus.

BACKGROUND

In Japanese Laid-open Patent Publication No. 2015-215193 discloses a film thickness measuring method of measuring a film thickness of a film formed on a substrate. This film thickness measuring method includes a film thickness coordinate acquisition step, a pixel value extraction step, a correlation data generation step, and a film thickness calculation step. The film thickness coordinate acquisition step acquires film thickness measured values obtained by measurement in advance at a plurality of points on a measurement preparation wafer and coordinates corresponding to the film thickness measured values, for a film formed on the measurement preparation wafer and having an uneven thickness. The pixel value extraction step extracts a pixel value at each coordinates acquired at the film thickness coordinate acquisition step from a preparation captured image obtained by imaging the measurement preparation wafer in advance by an imaging apparatus. The correlation data generation step generates correlation data between the pixel value extracted at each coordinates and the film thickness measured value at each coordinates. The film thickness calculation step images a wafer being a film thickness measurement object by the imaging apparatus to acquire a captured image, and calculates a film thickness of a film formed on the wafer being the film thickness measurement object on a basis of a pixel value of the captured image and the correlation data.

SUMMARY

An aspect of this disclosure is a substrate inspection method of inspecting a substrate, including: creating a correlation model indicating a relation between a pixel value in a captured image of the substrate and a feature amount of a film formed on the substrate, based on a measured result of a feature amount of a film formed on a model creating substrate by a measuring instrument and on a model creating captured image generated by imaging the model creating substrate by an imaging apparatus in a first substrate treatment system; imaging a feature amount acquisition object substrate by an imaging apparatus in a second substrate treatment system to generate a captured image, and calculating an estimated feature amount of a film formed on the feature amount acquisition object substrate, based on the captured image and on the correlation model; calculating a statistical value of the estimated feature amounts calculated for a plurality of the feature amount acquisition object substrates; and calculating an offset amount for the estimated feature amount from a measured result by a measuring instrument of a feature amount of a film formed by performing, on an offset calculating substrate in the second substrate treatment system, a same treatment as a formation treatment of the film whose estimated feature amount has been calculated and from the statistical value of the estimated feature amounts.

BRIEF DESCRIPTION OF THE DRAWINGS

FIG. 8 is a view illustrating an example of a captured image of a wafer W created in creating a correlation model or the like.

DETAILED DESCRIPTION

Figure 1:
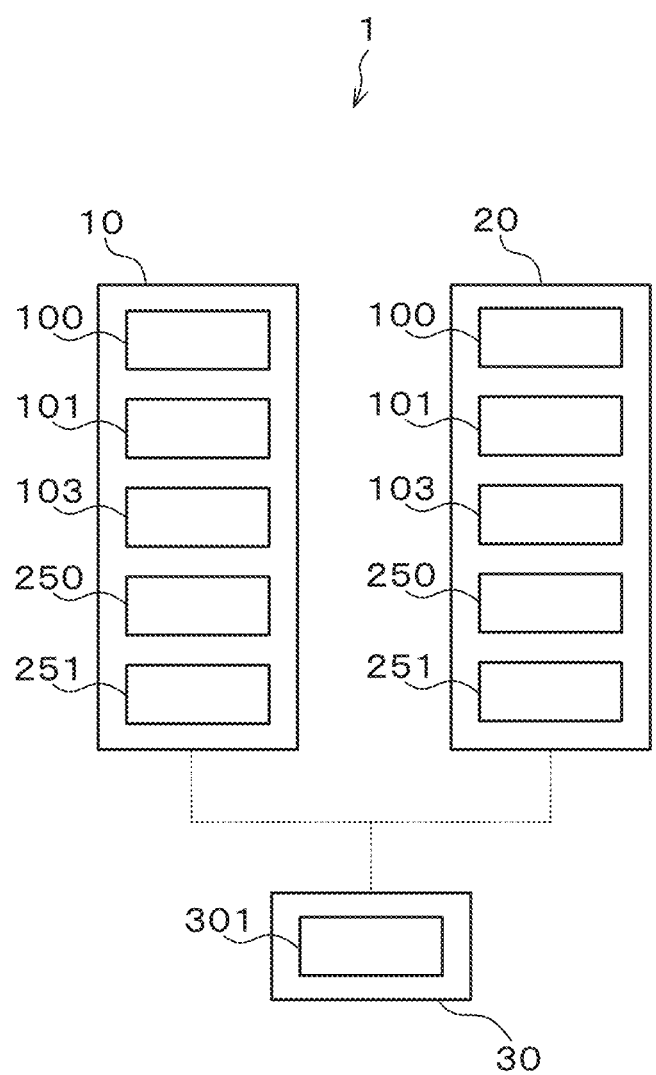
FIG. 1 is a view schematically illustrating the outline of a configuration of a substrate inspection system according to this embodiment.

In a manufacturing process of a semiconductor device or the like, predetermined treatments are performed in order to form a resist pattern on a semiconductor wafer (hereinafter, sometimes referred to as a "wafer"). The predetermined treatments are, for example, a resist coating treatment of supplying a resist solution onto the wafer to form a resist film, exposure processing of exposing the resist film to a predetermined pattern, a PEB treatment of accelerating a chemical reaction in the resist film after the exposure, and a developing treatment of developing the exposed resist film. Then, after the resist pattern formation treatment, etching is performed on a treatment object film using the resist pattern as a mask to form a predetermined pattern in the treatment object film. Further, in forming the resist pattern, a film other than the resist film such as a base film of the resist film is sometimes formed on the wafer.

To form the resist pattern in a desired shape and appropriately transfer the pattern to the treatment object film, it is necessary to manage the thickness and the like of each film to be formed on the wafer in forming the resist pattern.

Therefore, the thickness and the like of each film are measured for forming the resist pattern. As an example of a method of measuring the film thickness is a method of calculating the thickness of a film formed on the wafer from a captured image obtained by imaging the wafer as in Japanese Laid-open Patent Publication No. 2015-215193. The film thickness measuring method disclosed in Japanese Laid-open Patent Publication No. 2015-215193 acquires, specifically for a film having an uneven thickness formed on a measurement preparation wafer, film thickness measured values obtained by measuring in advance a plurality of points on the measurement preparation wafer and coordinates corresponding to the film thickness measured values. Then, a pixel value at each coordinates is extracted from a preparation captured image obtained by imaging the measurement preparation wafer in advance by an imaging apparatus. Subsequently, correlation data between the pixel value extracted at each coordinates and the film thickness measured value at each coordinates is generated. Then, a wafer being a film thickness measurement object is imaged by an imaging apparatus to acquire a captured image, and the film thickness of the film formed on the wafer being a film thickness measurement object is calculated based on the pixel value of the captured image and the correlation data.

Incidentally, a plurality of substrate treatment systems which perform treatments common among the systems on the wafer are introduced in a semiconductor fabrication plant in some cases. In this case, an imaging apparatus is provided in each of the substrate treatment systems, and in each of the substrate treatment systems, the thickness of the film formed by the above common treatments is calculated, for example, as in Japanese Laid-open Patent Publication No. 2015-215193 using the imaging apparatus provided in the substrate treatment system. Further, in this case, the film thickness cannot be accurately calculated in some cases if the above correlation data is used in common by the substrate treatment systems because the state of the image is different in each of the substrate treatment systems or the like, and therefore the above correlation data is generated conventionally for each of the substrate treatment systems. However, the generation of the above correlation data for each of the substrate treatment systems is very troublesome. For example, to generate the above correlation data for each of the substrate treatment systems in the case of simultaneously introducing the plurality of substrate treatment systems performing the common treatments, it is necessary to transport a correlation data generating wafer from one substrate treatment system to another substrate treatment system and the like.

Hence, the technique relating to this disclosure easily and accurately acquires a feature amount such as a thickness of a film formed on a substrate.

Hereinafter, a substrate inspection method, a substrate inspection system, and a control apparatus according to this embodiment will be explained referring to the drawings. Note that the same codes are given to components having substantially the same functional configurations in the description and the drawings to omit duplicated explanation.

FIG. 1 is a view schematically illustrating the outline of a configuration of a substrate inspection system according to this embodiment.

As illustrated, a substrate inspection system 1 includes two substrate treatment systems 10, 20. Note that the number of the substrate treatment systems included in the substrate inspection system 1 is two for easy explanation, but may be three or more.

In the first and second substrate treatment systems 10, 20, photolithography processing and the like are performed on a wafer W.

Figure 2:
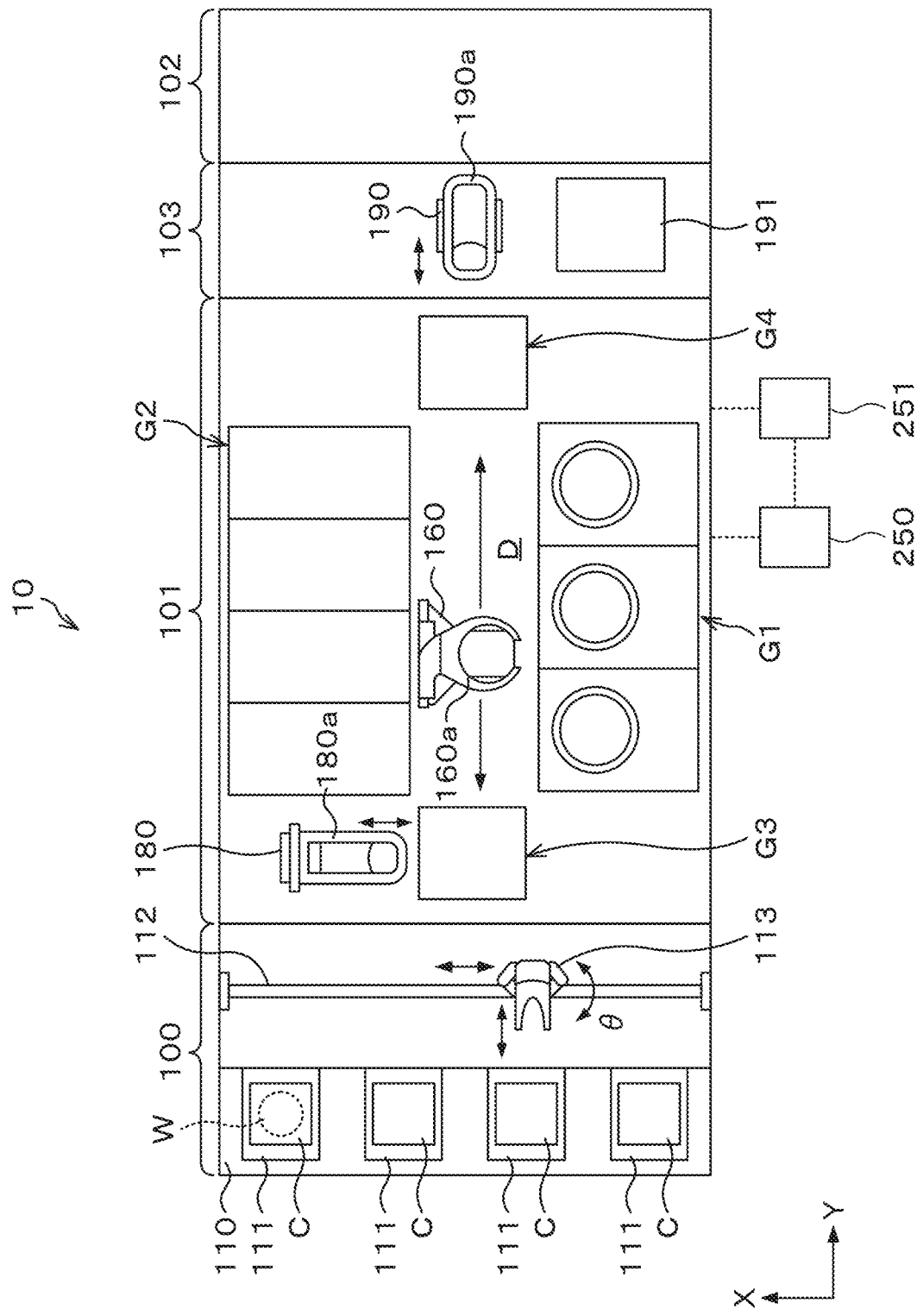
FIG. 2 is a plan view schematically illustrating the outline of a configuration of a first substrate treatment system.
Figure 3:
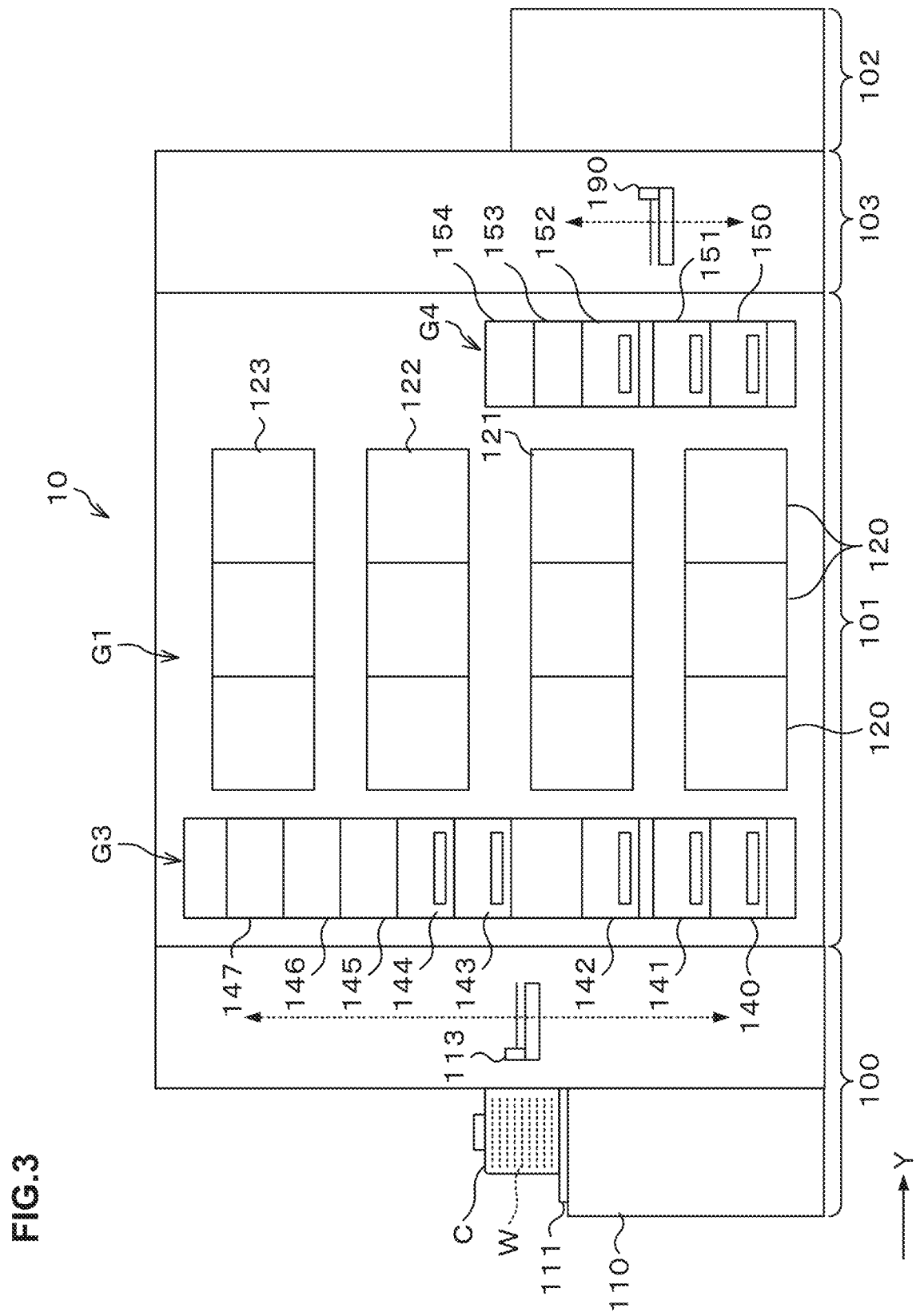
FIG. 3 is a front view schematically illustrating the outline of an internal configuration of the first substrate treatment system.
Figure 4:
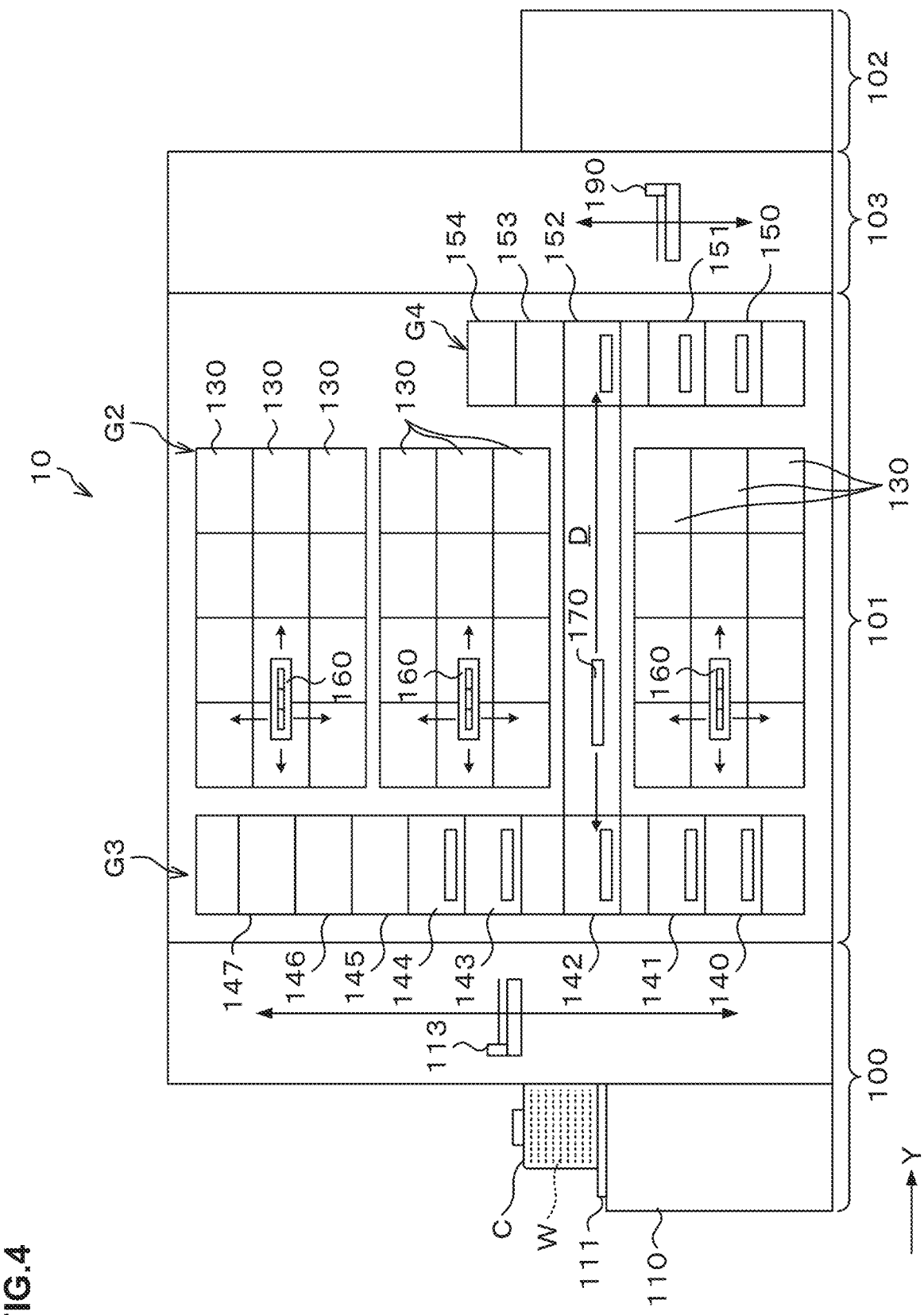
FIG. 4 is a rear view schematically illustrating the outline of the internal configuration of the first substrate treatment system.

FIG. 2 is a plan view schematically illustrating the outline of a configuration of the first substrate treatment system 10. FIG. 3 and FIG. 4 are a front view and a rear view schematically illustrating the outline of an internal configuration of the first substrate treatment system 10.

The first substrate treatment system 10 includes, as illustrated in FIG. 2, a cassette station 100 into/out of which a cassette C housing a plurality of wafers W is transferred, and a treatment station 101 including a plurality of treatment apparatuses which perform predetermined treatments on the wafer W. The first substrate treatment system 10 has a configuration in which the cassette station 100, the treatment station 101, and an interface station 103 which delivers the wafer W to/from an exposure apparatus 102 adjacent to the treatment station 101, are integrally connected.

In the cassette station 100, a cassette stage 110 is provided. On the cassette stage 110, a plurality of cassette stage plates 111 on each of which the cassette C is placed when the cassette C is transferred in/out from/to the outside of the first substrate treatment system 10 are provided.

In the cassette station 100, a wafer transfer apparatus 113 is provided which is movable on a transfer path 112 extending in an X-direction. The wafer transfer apparatus 113 is movable also in an up-down direction and around a vertical axis (in a θ-direction), and can transfer the wafer W between the cassette C on each of the cassette stage plates 111 and a delivery apparatus in a later-explained third block G3 in the treatment station 101.

In the treatment station 101, a plurality of, for example, four blocks, namely, a first block G1 to a fourth block G4 each including various apparatuses are provided. For example, the first block G1 is provided on the front side (an X-direction negative direction side in FIG. 2) in the treatment station 101, and the second block G2 is provided on the rear side (an X-direction positive direction side in FIG. 2, an upper side in the drawing) in the treatment station 101. Further, the aforementioned third block G3 is provided on the cassette station 100 side (a Y-direction negative direction side in FIG. 2) in the treatment station 101, and the fourth block G4 is provided on the interface station 103 side (a Y-direction positive direction side in FIG. 2) in the treatment station 101.

In the first block G1, solution treatment apparatuses being treatment apparatuses each of which performs a treatment on the wafer W using a treatment solution are arranged. More specifically, in the first block G1, for example, developing treatment apparatuses 120, lower-layer film forming apparatuses 121, intermediate-layer film forming apparatuses 122, and resist coating apparatuses 123 are arranged in this order from the bottom as illustrated in FIG. 3 as the treatment solution apparatuses.

The developing treatment apparatus 120 performs a developing treatment on the wafer W. More specifically, the developing treatment apparatus 120 supplies a developing solution onto a resist film of the wafer W to form a resist pattern.

The lower-layer film forming apparatus 121 forms a lower-layer film being a base film of the resist film of the wafer W. More specifically, the lower-layer film forming apparatus 121 applies a lower-layer film material being a material for forming the lower-layer film onto the wafer W to form a lower-layer film. The lower-layer film is, for example, an SOC (Spin On Carbon) film.

The intermediate-layer film forming apparatus 122 forms an intermediate-layer film at a position on the lower-layer film of the wafer W and below the resist film. More specifically, the inteiuiediate-layer film forming apparatus 122 applies an intermediate-layer film material being a material for forming an intermediate-layer film onto the lower-layer film of the wafer W to form an intermediate-layer film. The intermediate-layer film is, for example, an SOG (Spin on Glass) film.

The resist coating apparatus 123 applies a resist solution to the wafer W to form a resist film. More specifically, the resist coating apparatus 123 applies the resist solution onto the intermediate-layer film of the wafer W to form a resist film.

For example, the developing treatment apparatuses 120, the lower-layer film forming apparatuses 121, the intermediate-layer film forming apparatuses 122, and the resist coating apparatuses 123 are arranged three each side by side in the horizontal direction. Note that the numbers and the arrangements of these developing treatment apparatuses 120, lower-layer film forming apparatuses 121, intermediate-layer film forming apparatuses 122, and resist coating apparatuses 123 can be arbitrarily selected.

In the developing treatment apparatus 120, the lower-layer film forming apparatus 121, the intermediate-layer film forming apparatus 122, and the resist coating apparatus 123, predetermined treatment solutions are applied onto the wafer W, for example, by a spin coating method. In the spin coating method, the treatment solution is discharged, for example, from a coating nozzle onto the wafer W and the wafer W is rotated to diffuse the treatment solution over the surface of the wafer W.

In the second block G2, thermal treatment apparatuses 130 being treatment apparatuses each of which performs thermal treatments such as heating and cooling on the wafer W using a hot plate and a cooling plate on which the wafer W is placed are provided side by side in the up-down direction and in the horizontal direction. The numbers and the arrangement of the thermal treatment apparatuses 130 can be arbitrarily selected. Further, for the thermal treatment apparatus 130, a publicly-known apparatus can be used.

In the third block G3, a plurality of delivery apparatuses 140, 141, 142, 143, 144 are provided in order from the bottom, and inspection apparatuses 145, 146, 147 are provided in order from the bottom on the delivery apparatuses. Further, in the fourth block G4, a plurality of delivery apparatuses 150, 151, 152 are provided in order from the bottom, and inspection apparatuses 153, 154 are provided on the delivery apparatuses.

Here, the configuration of the inspection apparatus 145 will be explained.

Figure 5:
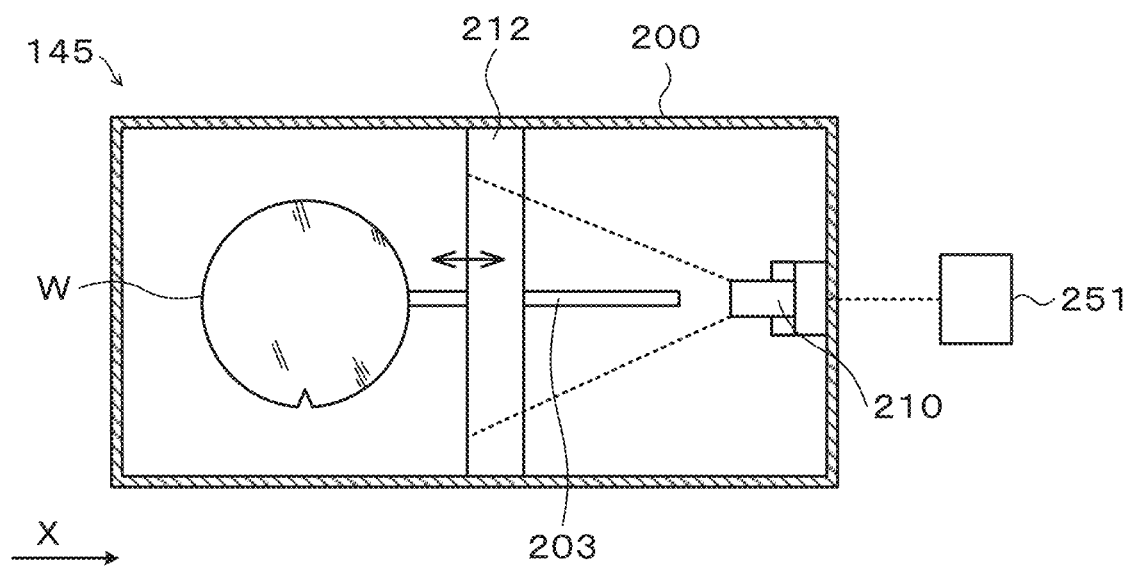
FIG. 5 is a longitudinal sectional view illustrating the outline of a configuration of an inspection apparatus.
Figure 6:
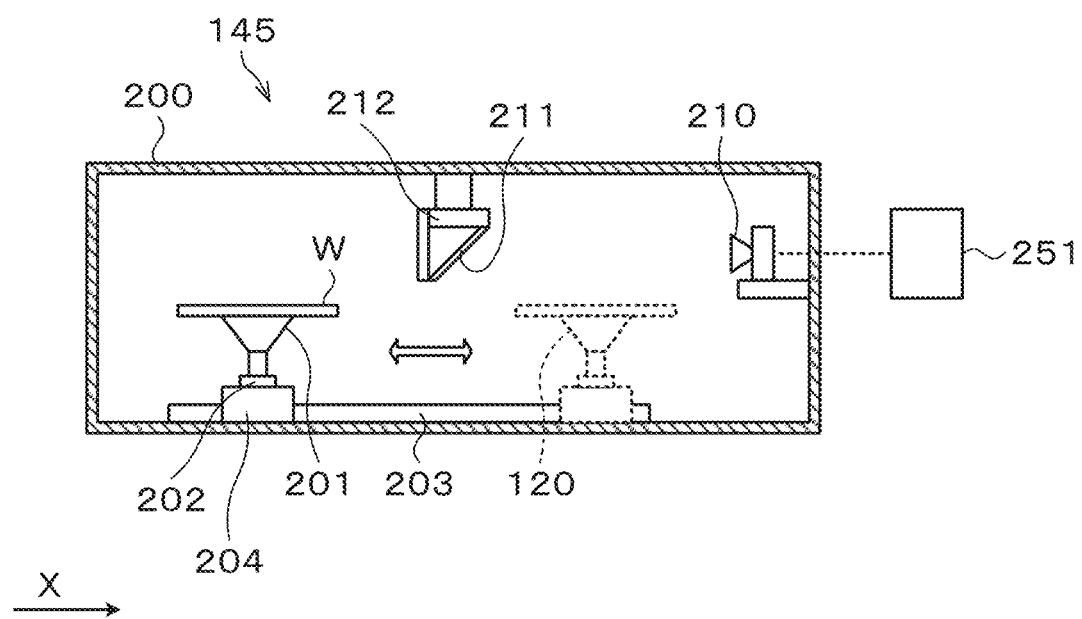
FIG. 6 is a transverse sectional view illustrating the outline of the configuration of the inspection apparatus.

FIG. 5 and FIG. 6 are a longitudinal sectional view and a transverse sectional view illustrating the outline of a configuration of the inspection apparatus 145, respectively.

The inspection apparatus 145 has a casing 200 as illustrated in FIG. 5 and FIG. 6. In the casing 200, a stage 201 on which the wafer W is to be placed is provided. The stage 201 can freely rotate and stop by a rotation drive 202 such as a motor. On a bottom surface of the casing 200, a guide rail 203 extending from one end side (an X-direction negative direction side in FIG. 6) to the other end side (an X-direction-positive direction side in FIG. 6) in the casing 200 is provided. The stage 201 and the rotation drive 202 are provided on the guide rail 203 and can move along the guide rail 203 by a drive apparatus 204.

On a side surface on the other end side (X-direction positive direction side in FIG. 6) in the casing 200, an imaging apparatus 210 is provided. For the imaging apparatus 210, for example, a wide-angle CCD camera is used.

Near the middle of the top of the casing 200, a half mirror 211 is provided. The half mirror 211 is provided at a position facing the imaging apparatus 210 in such a state that its mirror surface is inclined upward at 45 degrees toward a direction of the imaging apparatus 210 from a state of being directed vertically downward. Above the half mirror 211, an illumination apparatus 212 is provided. The half mirror 211 and the illumination apparatus 212 are fixed to the upper surface inside the casing 200. The illumination from the illumination apparatus 212 passes through the half mirror 211 and is applied downward. Accordingly, light reflected from an object existing below the illumination apparatus 212 is further reflected from the half mirror 211 and captured into the imaging apparatus 210. In other words, the imaging apparatus 210 can image the object existing within an irradiation region by the illumination apparatus 212.

Note that the configurations of the inspection apparatuses 146, 147, 153, 154 are the same as the configuration of the above-explained inspection apparatus 145.

The explanation will be returned to that of the first substrate treatment system 10 using FIG. 2 to FIG. 4.

As illustrated in FIG. 2, a wafer transfer region D is formed in a region surrounded by the first block G1 to the fourth block G4. In the wafer transfer region D, for example, a plurality of wafer transfer apparatuses 160 are arranged each of which has a transfer arm 160a movable, for example, in the Y-direction, the X-direction, the θ-direction, and the up-down direction. The wafer transfer apparatus 160 can move in the wafer transfer region D to transfer the wafer W to a desired apparatus in the first block G1, the second block G2, the third block G3, and the fourth block G4 located therearound.

Further, in the wafer transfer region D, a shuttle transfer apparatus 170 is provided which linearly transfers the wafer W between the third block G3 and the fourth block G4 as illustrated in FIG. 4.

The shuttle transfer apparatus 170 is linearly movable, for example, in the Y-direction in FIG. 4. The shuttle transfer apparatus 170 can move in the Y-direction while supporting the wafer W, and transfer the wafer W between the delivery apparatus 142 in the third block G3 and the delivery apparatus 152 in the fourth block G4.

As illustrated in FIG. 2, a wafer transfer apparatus 180 is provided adjacent on the X-direction positive direction side of the third block G3. The wafer transfer apparatus 180 has a transfer arm 180a movable, for example, in the X-direction, the θ-direction, and the up-down direction. The wafer transfer apparatus 180 can move up and down while supporting the wafer NV to transfer the wafer W to each of the delivery apparatuses in the third block G3.

In the interface station 103, a wafer transfer apparatus 190 and a delivery apparatus 191 are provided. The wafer transfer apparatus 190 has a transfer arm 190a movable, for example, in the Y-direction, the θ-direction, and the up-down direction. The wafer transfer apparatus 190 can transfer the wafer W between each of the delivery apparatuses in the fourth block G4, the delivery apparatus 191, and the exposure apparatus 102, for example, while supporting the wafer W by the transfer arm 190a.

Further, in the first substrate treatment system 10, a transfer and process controller 250 and an imaging controller 251 are provided, The transfer and process controller 250 (hereinafter, referred to as a "main controller 250" in some cases) is, for example, a computer including a CPU, a memory and so on, and includes a program storage (not illustrated). The program storage stores programs for controlling the operations a drive system of the above various treatment apparatuses, the transfer apparatuses and the like to perform the various treatment on the wafer W. Note that the above programs may be the ones that are recorded in a computer-readable storage medium and installed from the storage medium into the main controller 250. Part or all of the programs may be realized by dedicated hardware (circuit board).

The imaging controller 251 is, for example, a computer including a CPU, a memory and so on as with the main controller 250, and includes a program storage (not illustrated). The program storage stores programs for controlling the operations of the inspection apparatuses and a drive system in the imaging apparatuses to control the processing regarding the inspection apparatuses. Note that the above programs may be the ones that are recorded in a computer-readable storage medium and installed from the storage medium into the imaging controller 251. Part or all of the programs may be realized by dedicated hardware (circuit board).

The explanation will be returned to that of the substrate inspection system 1 using FIG. 1.

The configuration of the second substrate treatment system 20 included in the substrate inspection system 1 is the same as the configuration of the above first substrate treatment system 10.

The substrate inspection system 1 further includes a total controller 30 as a control apparatus.

The total controller 30 is, for example, a computer including a CPU, a memory and so on, and includes a program storage (not illustrated). The program storage stores a program for creating a later-explained correlation model and a program for calculating a later-explained offset amount. Note that the above programs may be the ones that are recorded on a computer-readable storage medium and installed from the storage medium into the total controller 30. Part or all of the programs may be realized by dedicated hardware (circuit board).

Note that the total controller 30 includes a data storage 301 which accumulates captured images of the wafer W acquired from results of imaging the wafer W by the imaging apparatus 210. The data storage 301 is composed of a computer-readable storage device.

In the above substrate inspection system 1, each of the substrate treatment systems 10, 20 performs a treatment of forming a resist pattern on the wafer W, and estimates and acquires a feature amount of a film such as a thickness of each film such as the lower-layer film formed during the treatment, a line width of the formed resist pattern or the like. Further, in the substrate treatment system 10, 20, the above feature amount of a film is calculated based on a pixel value of the captured image of the wafer W acquired from the result obtained by imaging the wafer W on which the film is formed by an imaging apparatus corresponding to the film and on the correlation model. The correlation model is a model indicating a correspondence between the feature amount of a film and the pixel value in the captured image of the wafer W on which the film is formed, more specifically, a model expressing, for example, the feature amount of a film by an north degree (n is an integer of 1 or more) function using the pixel value of the captured image of the wafer W as a variable. This correlation model also called as a "calibration curve" is preliminarily created before the treatment of forming the resist pattern is performed. Besides, the correlation model is preliminarily created for each kind of the feature amount of a film, more specifically, is preliminarily created for each of, for example, the thickness of the lower-layer film, the thickness of the intermediate-layer film, the thickness of the resist film, and the line width of the resist pattern.

Conventionally, respective correlation models are individually created for the first substrate treatment system 10 and the second substrate treatment system 20. However, the individual creation takes much time. As a result of the earnest study of this point by the present inventors, it has been found that the substrate treatment systems exhibit the similar tendency of the change in the feature amount of a film with respect to the change in the pixel value of the captured image of the wafer W. More specifically it has been found that in the case of using, as the correlation model, a model expressing the feature amount of a film by the n-th degree (n is an integer of 1 or more) function using the pixel value of the captured image of the wafer W as a variable, what is different between the substrate treatment systems is a portion of a constant term of the above n-th degree function, namely, a portion of an intercept.

Hence, in the substrate inspection system 1, each correlation model is preliminarily created by the total controller 30 based on the captured image of the wafer W acquired by the first substrate treatment system 10. Then, each correlation model created is used for estimation of the feature amount of a film in both the first substrate treatment system 10 and the second substrate treatment system 20. However, the use mode of an estimated feature amount of a film is different between the first substrate treatment system 10 and the second substrate treatment system 20. More specifically, for example, in the first substrate treatment system 10, correction of treatment conditions of the various treatments and the like are performed based on the estimated feature amount of a film immediately after the start of estimation using the correlation model. In contrast to this, in the second substrate treatment system 20, for example, a later-explained offset amount is calculated at predetermined timing after the start of estimation of the feature amount of a film using the correlation model. Then, in the second substrate treatment system 20, the estimated feature amount of a film is corrected by the above offset amount, and correction of treatment conditions of the various treatments and the like are performed based on the corrected estimated feature amount of a film.

Hereinafter, this will be concretely explained.

Figure 7:
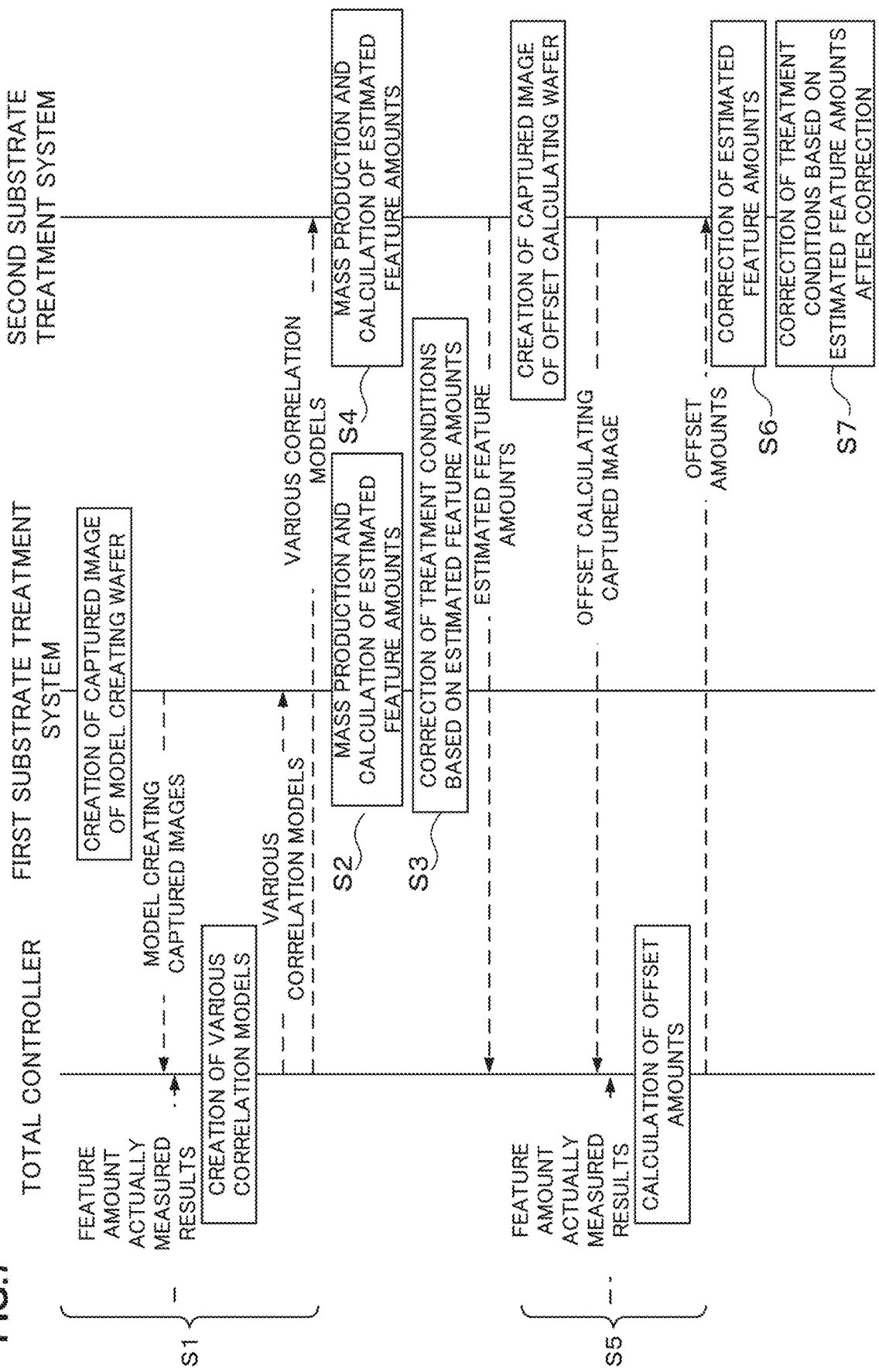
FIG. 7 is a chart for explaining an example of the flow of treatments and the flow of data in the substrate inspection system in FIG. 1.
Figure 8:
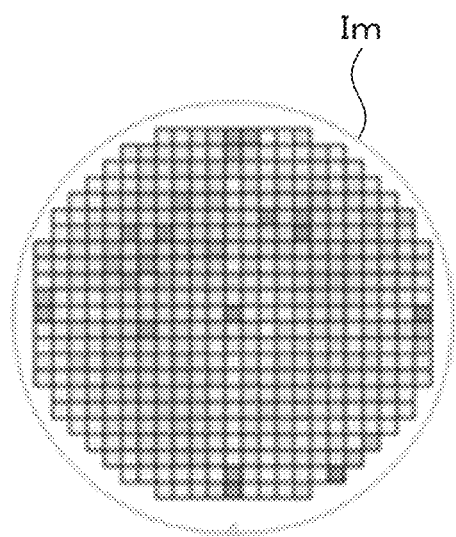

FIG. 7 is a chart for explaining an example of the flow of treatments and the flow of data in the substrate inspection system 1. FIG. 8 is a view illustrating an example of the captured image of the wafer W created in creating the correlation model or the like.

1. Correlation Model Creation Process

As illustrated in FIG. 7, in the substrate inspection system 1, the correlation model is preliminarily created for each kind of the feature amount of a film based on the imaging result in the imaging apparatus 210 of the first substrate treatment system 10 before a resist pattern formation treatment is performed in a mass production manner in each of the substrate treatment systems 10, 20 (Step S1).

1.1. Initial State Imaging Process

In the correlation model creation process, first, the wafer W for creating the correlation model (hereinafter, referred to as a "model creating wafer W") before various films such as the lower-layer film and so on are formed thereon, namely, in an initial state is imaged in the first substrate treatment system 10.

More specifically, for example, under control of the main controller 250, the model creating wafer W housed in the cassette C placed on the cassette stage 110 is taken out and transferred to the inspection apparatus 145. Then, under control of the imaging controller 251, the surface of the model creating wafer W is imaged by the imaging apparatus 210 of the inspection apparatus 145. Then, the imaging controller 251 acquires the captured image of the model creating wafer W in the initial state based on the imaging result in the imaging apparatus 210. For example, the model creating wafer W in the imaging result in the imaging apparatus 210 is partitioned into 437 regions, and an average value of pixel values of each of R (red), G (green), B (blue) is calculated in each of the regions. Then, for each of the regions (pixels), a table associating coordinates of the region and the average values of the pixel values, namely, the average values of RGB data is created. Further, the table is calibrated in accordance with the optical system or the like in the inspection apparatus 145. Based on the calibrated table, an image Im as illustrated in FIG. 8 can be acquired as a captured image of the model creating wafer W in the initial state (hereinafter, referred to as an "initial state captured image"). Hereinafter, the image as illustrated in FIG. 8 acquired as in the above manner from the imaging result in the imaging apparatus 210 is referred to as a "capture image" unless otherwise stated.

The initial state captured image, more specifically, the above table for generating this captured image (hereinafter, referred to as a "captured image generation table") is sent from the imaging controller 251 to the total. controller 30 and stored in the data storage 301.

Note that the model creating wafer W is, for example, a production wafer used in mass production treatment of semiconductor devices, namely, in forming the resist pattern in a mass production manner, and patterns are formed on the wafer surface.

1.2. Lower-Layer Film Formation Process

After the initial state imaging process, a lower-layer film is formed on the model creating wafer W in the first substrate treatment system 10. More specifically, under control of the main controller 250, the model creating wafer W is transferred to the lower-layer film forming apparatus 121 and a lower-layer film is formed on the model creating wafer W under the predetermined coating treatment conditions.

1.3. Lower-Layer Film Baking Process

Thereafter, a heating treatment of the lower-layer film, namely, a lower-layer film baking treatment is performed on the model creating wafer W. More specifically, under control of the main controller 250, the model creating wafer W is transferred to the thermal treatment apparatus 130 for the lower-layer film baking treatment and subjected to the lower-layer film baking treatment under the predetermined thermal treatment conditions.

1.4. Post-Lower-Layer Film Formation Imaging Process

Subsequently, the model creating wafer W on which the lower-layer film is formed is imaged.

More specifically, for example, under control of the main controller 250, the model creating wafer W is transferred to the inspection apparatus 153. Then, under control of the imaging controller 251, the surface of the model creating wafer W is imaged by the imaging apparatus 210 in the inspection apparatus 153. Then, the imaging controller 251 acquires a captured image of the model creating wafer W after the formation of the lower-layer film (hereinafter, referred to as a "post-lower-layer film formation captured image") based on the imaging result in the imaging apparatus 210, more specifically, acquires a captured image generation table.

The acquired captured image (more specifically, the captured image generation table) is sent from the imaging controller 251 to the total controller 30 and stored in the data storage 301.

1.5. Lower-Layer Film Thickness Actual Measurement Process

Subsequently to the post-lower-layer film formation imaging process, the thickness of the lower-layer film formed on the model creating wafer W is measured by a film thickness measurer (not illustrated) as a measuring instrument provided outside the first substrate treatment system 10.

More specifically, for example, under control of the main controller 250, the model creating wafer W is first returned to the cassette C placed on the cassette stage 110. Then, the cassette is moved to the film thickness measurer, the model creating wafer W is taken out, and the film thickness of the lower-layer film is measured by the film thickness measurer. For example, the model creating wafer W is partitioned into 437 regions that is the same as the number of the partitioned regions of the captured image, and the film thickness of the lower-layer film on each of the regions is measured.

The measured result is input into the total controller 30. Note that as the film thickness measurer, for example, a thickness meter utilizing a reflection spectrum system or the like is used.

1.6. Lower-Layer Film Thickness Correlation Model Creation Process

After the film thickness actual measurement process, a correlation model of the thickness of the lower-layer film is created based on the measured result of the thickness of the lower-layer film formed on the model creating wafer W by the film thickness measurer and on the captured image of the model creating wafer W after the formation of the lower-layer film.

More specifically, in the total controller 30, the correlation model of the thickness of the lower-layer film indicating the correspondence between the film thickness of the lower-layer film and the pixel value in the captured image of the wafer W on which the lower-layer film is created from the measured result by the film thickness measurer and the pixel value in the post-lower-layer film formation captured image in each of the above 437 regions of the model creating wafer W.

Note that in creating the correlation model of the film thickness of the lower-layer film, the pixel value in the post-lower-layer film formation captured image may be corrected based on the pixel value in the initial state captured image so as to remove the influence of the initial state captured image.

1.7. Intermediate-Layer Film Formation Process

Further, after the film thickness actual measurement process, an intermediate-layer film is formed on the lower-layer film of the model creating wafer W in the first substrate treatment system 10.

More specifically, the cassette C housing the model creating wafer W is returned to the first substrate treatment system 10 and, under control of the main controller 250, the model creating wafer W is taken out of the cassette C and transferred to the intermediate-layer film forming apparatus 122, and an intermediate-layer film is formed on the lower-layer film of the model creating wafer W under predetermined coating treatment conditions.

1.8. Intermediate-Layer Film Baking Process

Thereafter, a heating treatment of the intermediate-layer film, namely, an intermediate-layer film baking treatment is performed on the model creating wafer W. More specifically, under control of the main controller 250, the model creating wafer W is transferred to the thermal treatment apparatus 130 for the intermediate-layer film baking treatment and subjected to the intermediate-layer film baking treatment under predetermined thermal treatment conditions.

1.9. Post-Intermediate-Layer Film Imaging Process

Subsequently, the model creating wafer W on which the intermediate-layer film is formed is imaged.

More specifically, for example, under control of the main controller 250, the model creating wafer W is transferred to the inspection apparatus 146. Then, under control of the imaging controller 251, the surface of the model creating wafer W is imaged by the imaging apparatus 210 in the inspection apparatus 146. Then, the imaging controller 251 acquires a captured image of the model creating wafer W after the formation of the intermediate-layer film (hereinafter, referred to as a "post-intermediate-layer film formation captured image") based on the imaging result in the imaging apparatus 210, more specifically, acquires a captured image generation table as in the initial state imaging process.

The acquired captured image (more specifically, the captured image generation table) is sent from the imaging controller 251 to the total controller 30 and stored in the data storage 301.

1.10. Intermediate-Layer Film Thickness Actual Measurement Process

Subsequently to the post-intermediate-layer film formation imaging process, the thickness of the intermediate-layer film formed on the model creating wafer W is measured by the film thickness measurer (not illustrated) provided outside the first substrate treatment system 10 as in the lower-layer film thickness actual measurement process. Note that the thickness of the intermediate-layer film may be calculated from the measured result in the film thickness measurer in this process and the measured result of the thickness of the lower-layer film.

The measured result of the thickness of the intermediate-layer film is input into the total controller 30.

1.11. Intermediate-Layer Film Thickness Correlation Model Creation Process

After the film thickness actual measurement process, a correlation model of the thickness of the intermediate-layer film is created based on the measured result of the thickness of the intermediate-layer film formed on the model creating wafer W by the film thickness measurer and on the captured image of the model creating wafer W after the formation of the intermediate-layer film as in the lower-layer film thickness correlation model creation process.

1.12. Resist Film Formation Process

Further, after the intermediate-layer film thickness actual measurement process, a resist film is formed on the intermediate-layer film of the model creating wafer W in the first substrate treatment system 10.

More specifically the cassette C housing the model creating wafer W is returned to the first substrate treatment system 10 and, under control of the main controller 250, the model creating wafer W is taken out of the cassette C and transferred to the resist coating apparatus 123, and a resist film is formed on the intermediate-layer film of the model creating wafer W under predetermined coating treatment conditions.

1.13. PAB Process

Thereafter, a pre-exposure heating treatment, namely, a pre-baking (PAB: Pre-Applied Bake) treatment of the resist film is performed on the model creating wafer W. More specifically, under control of the main controller 250, the model creating wafer W is transferred to the thermal treatment apparatus 130 for the PAB treatment and subjected to the PAB treatment under predetermined thermal treatment conditions.

1.14. Post-Resist Film Formation Imaging Process

Subsequently, the model creating wafer W on which the resist film is formed is imaged.

More specifically, for example, under control of the main controller 250, the model creating wafer W is transferred to the inspection apparatus 153. Then, under control of the imaging controller 251, the surface of the model creating wafer W is imaged by the imaging apparatus 210 in the inspection apparatus 153. Then, the imaging controller 251 acquires a captured image of the model creating wafer W after the formation of the resist film (hereinafter, referred to as a "post-resist film formation captured image") based on the imaging result in the imaging apparatus 210, more specifically, acquires a captured image generation table as in the initial state imaging process.

The acquired captured image (more specifically, the captured image generation table) is sent from the imaging controller 251 to the total controller 30 and stored in the data storage 301.

1.15. Resist Film Thickness Actual Measurement Process

Subsequently to the post-resist film formation imaging process, the thickness of the resist film formed on the model creating wafer W is measured by the film thickness measurer (not illustrated) provided outside the first substrate treatment system 10 as in the lower-layer film thickness actual measurement process. Note that the thickness of the resist film may be calculated from the measured result in the film thickness measurer in this process, the measured result of the thickness of the lower-layer film, and the measured result of the thickness of the intermediate-layer.

The measured result of the thickness of the resist film is input into the total controller 30.

1.16. Resist Film Thickness Correlation Model Creation Process

After the above film thickness actual measurement process, a correlation model of the thickness of the resist film is created based on the measured result of the thickness of the resist film formed on the model creating wafer W by the film thickness measurer and on the captured image of the model creating wafer W after the formation of the resist film as in the lower-layer film thickness correlation model creation process.

1.17. Exposure Process

Further, after the resist film thickness actual measurement process, exposure processing is performed on the model creating wafer W in the first substrate treatment system 10.

More specifically, the cassette C housing the model creating wafer W is returned to the first substrate treatment system 10 and, under control of the main controller 250, the model creating wafer W is taken out of the cassette C and transferred to the exposure apparatus 102, in which the exposure processing is performed on the wafer W under predetermined exposure processing conditions and thereby the resist film is exposed into a predetermined pattern.

1.18. PEB Process

Thereafter, a post-exposure heating treatment, namely, a post-baking (PEB: Post-Exposure Bake) treatment of the resist film is performed on the model creating wafer W. More specifically, under control of the main controller 250, the model creating wafer W is transferred to the thermal treatment apparatus 130 for the PEB treatment and subjected to the PEB treatment under predetermined thermal treatment conditions.

1.19. Development Process

Next, a developing treatment is performed on the model creating wafer W. More specifically, under control of the main controller 250, the model creating wafer W is transferred to the developing treatment apparatus 120 and subjected to the developing treatment under predetermined treatment conditions and thereby a resist pattern is formed on the wafer W.

1.20. Post-Pattern Formation Imaging Process

Subsequently, the model creating wafer W on which the resist pattern is formed is imaged.

More specifically, for example, under control of the main controller 250, the model creating wafer W is transferred to the inspection apparatus 147. Then, under control of the imaging controller 251, the surface of the model creating wafer W is imaged by the imaging apparatus 210 in the inspection apparatus 147. Then, the imaging controller 251 acquires a captured image of the model creating wafer W after the formation of the resist pattern (hereinafter, referred to as a "post-pattern formation captured image") based on the imaging result in the imaging apparatus 210, more specifically, acquires a captured image generation table as in the initial state imaging process.

The acquired captured image (more specifically, the captured image generation table) is sent from the imaging controller 251 to the total controller 30 and stored in the data storage 301.

1.21. Resist Pattern Line Width Actual Measurement Process

Subsequently to the post-pattern formation imaging process, the line width of the resist pattern formed on the model creating wafer W is measured by a line width measurer (not illustrated) provided outside the first substrate treatment system 10.

More specifically, for example, under control of the main controller 250, the model creating wafer W is first returned to the cassette C placed on the cassette stage 110. Then, the cassette is moved to the line width measurer, the model creating wafer W is taken out, and the line width of the resist pattern is measured in the line width measurer. For example, the model creating wafer W is partitioned into 437 regions that is the same as the number of the partitioned regions of the captured image, and the line width of the resist pattern on each of the regions is measured.

The measured result is input into the total controller 30. Note that as the line width measurer, for example, a SEM (Scanning Electron Microscope) is used.

1.22. Resist Pattern Line Width Correlation Model Creation Process

After the line width actual measurement process, a correlation model of the resist pattern is created based on the measured result of the line width of the resist pattern formed on the model creating wafer W by the line width measurer and on the captured image of the model creating wafer W after the formation of the resist pattern as in the lower-layer film thickness correlation model creation process.

Note that the various kinds of correlation models created as above in the correlation model creation process at Step S1 are sent to the first substrate treatment system 10 and the second substrate treatment system 20.

2. Mass Production And Estimated Feature Amount Calculation Process

Once the preliminary creation of the correlation models is completed in the correlation model creation process at Step S1, the resist pattern formation treatment is performed in a mass production manner and calculation of the estimated feature amount of each film based on the created correlation model is performed in the first substrate treatment system 10 (Step S2).

2.1. Resist Pattern Mass-Production Formation Process

In the process at Step S2, the same treatments as those in the above 1.2. lower-layer film formation process, 1.3. lower-layer film baking process, 1.7. intermediate-layer film formation process, 1.8. intermediate-layer film baking process, 1.12. resist film formation process, 1.13. PAB process, 1.17. exposure process, 1.18. PEB process, and 1.19. development process are concretely performed on the wafer W as the resist-pattern formation treatment. Thus, the lower-layer film, the intermediate-layer film, and the resist film are stacked on the wafer W, and then the resist pattern is formed. In mass production, the above resist pattern formation treatment is performed on each of many wafers W.

2.2. Estimated Feature Amount Calculation Process

Besides, in the process at Step S2, the same processing as that in the above 1.1. initial state imaging process, 1.4. post-lower-layer film formation imaging process, 1.9. post-intermediate-layer film imaging process, 1.14. post-resist film formation imaging process, and 1.20. post-pattern formation imaging process is performed on each of the wafers W in the resist pattern formation treatment. Thus, the initial state captured image, the post-lower-layer film formation captured image, the post-intermediate-layer film formation captured image, the post-resist film formation captured image, and the post-pattern formation captured image are acquired for each of the wafers W in mass production. Then, for each of the wafers W, the estimated value of the thickness of the lower-layer film is calculated by the imaging controller 251 in the first substrate treatment system 10 based on the post-lower-layer film limitation captured image in mass production and on the correlation model of the thickness of the lower-layer film acquired at Step S1. More specifically, for each of the wafers W the estimated value of the thickness of the lower-layer film, in other words, the estimated feature amount of the lower-layer film is calculated for each partitioned region of the wafer W based on the pixel value in each partitioned region of the post-lower-layer film formation captured image in mass production and on the above correlation model. Similarly, in the process at Step S2, for each of the wafers W used for mass production, other estimated feature amounts, more specifically, the estimated value of the thickness of the intermediate-layer film, the estimated value of the thickness of the resist film, and the estimated value of the line width of the resist pattern are also calculated.

Further, the estimated feature amount of each film calculated for each of the wafers W is stored in the storage (not illustrated) of the imaging controller 251.

Note that the wafers W used in mass production can be said a feature amount acquisition object wafer W because the feature amount is calculated and acquired for these wafers W as explained above.

3. Treatment Condition Correction Process

In the first substrate treatment system 10, after the start of the process at Step S2, the treatment conditions of the treatment on the wafer W in the first substrate treatment system 10 are corrected by the main controller 250 at predetermined timing based on the calculated estimated feature amount of each film (Step S3). The predetermined timing is the maintenance time or the time when a predetermined time period after the start of the process at Step S2 is exceeded.

In this process, for example, a statistical value (for example, the average value or the like) of film thickness estimated values of the lower-layer films during the mass production period is calculated for a specific partitioned region within the wafer W, and the treatment conditions of the lower-layer film formation treatment (for example, the wafer rotation number in the lower-layer film formation process and the wafer temperature in the lower-layer film baking process) are corrected based on the calculation result.

In the first substrate treatment system 10, the above Step S2 and Step S3 are repeatedly performed.

4. Mass Production and Estimated Feature Amount Calculation Process

As in the first substrate treatment system 10, after the correlation model creation process at Step S1, the resist pattern formation treatment is performed in a mass production manner and calculation of the estimated feature amount of each film based on the correlation model is performed in the second substrate treatment system 20 (Step S4). More specifically, in the second substrate treatment system 20, the same processing as that in the above 2.1. resist pattern mass-production formation process and 2.2. estimated feature amount calculation process is performed and the same correlation model used in the first substrate treatment system 10 is used for the calculation of the estimated feature amount of each film.

However, in the second substrate treatment system 20, the calculated estimated feature amount of each film, as it is, is not used for correction of the treatment conditions of the treatment on the wafer W in the second substrate treatment system 20.

Further, the estimated feature amount of each film calculated for each of the wafers W in the second substrate treatment system 20 is not only stored in the storage (not illustrated) of the imaging controller 251 of the system 20 but also sent to the total controller 30.

5. Offset Amount Calculation Process

In the second substrate treatment system 20, after the start of Step S4, the offset amount for the estimated feature amount is calculated for each kind of the feature amount of a film at predetermined timing. The predetermined timing is the maintenance time or the time when a predetermined time period after the start of the process at Step S4 is exceeded.

5.1. Lower-Layer Film Formation Process

In the offset amount calculation process, for example, first, a lower-layer film is formed on a wafer W for calculating the offset amount (hereinafter, referred to as an "offset wafer W") in the second substrate treatment system 20. More specifically, under control of the main controller 250, the offset wafer W housed in the cassette C placed on the cassette stage 110 is taken out and transferred to the lower-layer film forming apparatus 121. Then, a lower-layer film is formed on the offset wafer W under the same coating treatment conditions as those of the treatment at the time when forming the lower-layer film whose estimated feature amount has been calculated.

Note that the offset wafer W is, for example, a bare wafer.

5.2. Lower-Layer Film Baking Process

Thereafter, the lower-layer film baking treatment is performed on the offset wafer W in the second substrate treatment system 20. More specifically, under control of the main controller 250, the offset wafer W is transferred to the thermal treatment apparatus 130 for the lower-layer film baking treatment and subjected to a lower-layer film baking treatment under the same thermal treatment conditions as those in the treatment at the time when forming the lower-layer film whose estimated feature amount has been calculated.

5.3. Lower-Layer Film Thickness Actual Measurement Process

Subsequently to the lower-layer film baking process, the thickness of the lower-layer film formed on the offset wafer W is measured by a film thickness measurer (not illustrated) as a measuring instrument provided outside the second substrate treatment system 20. More specifically, for example, the same processing as that of the above 1.5. lower-layer film thickness actual measurement process is performed, in which the offset wafer W is partitioned into 437 regions that is the same as the number of the partitioned regions of the captured image, and the film thickness of the lower-layer film on each of the regions is measured. The measured result is input into the total controller 30.

5.4. Lower-Layer Film Estimated Feature Amount Offset Amount Calculation Process After the film thickness actual measurement process, the offset amount for the estimated feature amount of the lower-layer film is calculated. More specifically, first, a statistical value of the estimated feature amounts of the lower-layer films respectively calculated for a plurality of wafers W at Step S4 is calculated by the total controller 30. The above statistical value is, for example, an average value. Then, the offset amount (+20 nm) of the estimated feature amount of the lower-layer film is calculated by the total controller 30 from the statistical value of the estimated feature amounts of the lower-layer films, namely, the statistical value (for example, 80 nm) of the estimated values of the thickness of the lower-layer films and from the thickness (for example, 100 nm) of the lower-layer film measured by the film thickness measurer. More specifically, the offset amount for the estimated feature amount of the lower-layer film is calculated, for example, from a total average of in-plane average values of the estimated feature amounts of the lower-layer films and from an in-plane average of the feature amounts, that is, the thicknesses of the lower-layer films measured by the film thickness measurer.

5.5. Intermediate-Layer Film Formation Process

Further, in the second substrate treatment system 20, an intermediate-layer film is formed not on the lower-layer film of the offset wafer W but directly on the wafer. More specifically, under control of the main controller 250, the offset wafer W housed in the cassette C placed on the cassette stage 110 is taken out and transferred to the intermediate-layer film forming apparatus 122. Then, an intermediate-layer film is formed on the offset wafer W under the same coating treatment conditions as those of the treatment at the time when forming the intermediate-layer film whose estimated feature amount has been calculated.

5.6. Intermediate-Layer Film Baking Process

Thereafter, an intermediate-layer film baking treatment is performed on the offset wafer W in the second substrate treatment system 20. More specifically, under control of the main controller 250, the offset wafer W is transferred to the thermal treatment apparatus 130 for the intermediate-layer film baking treatment and subjected to the intermediate-layer film baking treatment under the same thermal treatment conditions as those of the treatment at the time when forming the intermediate-layer film whose estimated feature amount has been calculated.

5.7. Intermediate-Layer Film Thickness Actual Measurement Process

Subsequently to the intermediate-layer film baking process, the thickness of the intermediate-layer film formed on the offset wafer W is measured by the film thickness measurer (not illustrated) as the measuring instrument provided outside the second substrate treatment system 20. More specifically, for example, the same processing as that of the above 1.10. intermediate-layer film thickness actual measurement process is performed. The measured result is input into the total controller 30.

5.8. Intermediate-Layer Film Estimated Feature Amount Offset Amount Calculation Process After the intermediate-layer film thickness actual measurement process, the offset amount for the estimated feature amount of the intermediate-layer film is calculated by the total controller 30. More specifically, the same processing as that in the 5.4. lower-layer film estimated feature offset amount calculation process is performed.

5.9. Resist Film Formation Process

Further, in the second substrate treatment system 20, a resist film is formed directly on the offset wafer W as with the intermediate-layer film. More specifically, under control of the main controller 250, the offset wafer W housed in the cassette C placed on the cassette stage 110 is taken out and transferred to the resist coating apparatus 123. Then, a resist film is formed on the offset wafer W under the same coating treatment conditions as those of the treatment at the time when forming the resist film whose estimated feature amount has been calculated.

5.10. Resist Film Baking Process

Thereafter, the PAB treatment is performed on the offset wafer W in the second substrate treatment system 20. More specifically, under control of the main controller 250, the offset wafer W is transferred to the thermal treatment apparatus 130 for the PAB treatment and subjected to the PAB treatment under the same thermal treatment conditions as those of the treatment at the time when forming the resist film whose estimated feature amount has been calculated.

5.11. Resist Film Thickness Actual Measurement Process

Subsequently to the resist film baking process, the thickness of the resist film formed on the offset wafer W is measured by the film thickness measurer (not illustrated) as the measuring instrument provided outside the second substrate treatment system 20. More specifically, for example, the same processing as that of the above 1.15. resist film thickness actual measurement process is performed. The measured result is input into the total controller 30.

5.12. Resist Film Estimated Feature Amount Offset Amount Calculation Process After the resist film thickness actual measurement process, the offset amount for the estimated feature amount of the resist is calculated by the total controller 30. More specifically, the same processing as that of the 5.4. lower-layer film estimated feature offset amount calculation process is performed.

5.13. Resist Pattern Line Width Actual Measurement Process

Furthermore, the line width of the resist pattern formed on the wafer W whose resist pattern estimated feature amount has been calculated is measured by a line width measurer (not illustrated) such as a SEM provided outside the second substrate treatment system 20.

More specifically, for example, during the mass production at Step S4, the wafer W returned to the cassette C after the formation of the resist pattern is taken out and transferred into the line width measurer, in which the line width of the resist pattern on the wafer W is measured. For example, the wafer W is partitioned into 437 regions that is the same as the number of the partitioned regions of the captured image, and the line width of the resist pattern on each of the regions is measured.

The measured result is input into the total controller 30.

5.14. Resist Pattern Line Width Offset Amount Calculation Process

After the line width actual measurement process, the offset amount for the estimated feature amount of the resist pattern is calculated by the total controller 30. More specifically, the same processing as that of the 5.4 lower-layer film estimated feature offset amount calculation process is performed based on the measured result of the line width of the resist pattern.

Note that a plurality of treatment apparatuses are provided for each kind in the second substrate treatment system 20. In the case of calculating the offset amount for each kind of feature amount as explained above, the treatment apparatus which has performed the treatment on the wafer W whose feature amount is to be actually measured and the treatment apparatus which has performed the treatment on the wafer W whose estimated feature amount to be used for the calculation of the offset amount has been acquired are preferably the same treatment apparatus.

Note that the various offset amounts created as in the above manner in the offset amount calculation process at Step S5 are sent to the second substrate treatment system 20.

6. Estimated Feature Amount Correction Process

After the offset amount calculation process at Step S5, in the second substrate treatment system 20, the calculated estimated value of each film is corrected by the imaging controller 251 based on the offset amount (Step S6). More specifically, for example, the offset amount for the estimated feature amount is added to the estimated feature amount of a film, which is calculated at Step S4, for each kind of the feature amount of the film and for each of the wafers W and stored in the storage of the imaging controller 251, to make an estimated feature amount of a film after correction and stored in the storage. Further, the estimated feature amount of a film after correction may be sent to the total controller 30.

7. Treatment Condition Correction Process

In the second substrate treatment system 20, after the estimated feature amount correction process at Step S6, the treatment conditions of the treatment on the wafer W in the second substrate treatment system 20 are corrected by the main controller 250 based on the corrected estimated feature amount of each film (Step S7). More specifically, the same correction as at Step S3 is performed based on the corrected estimated feature amount of each film.

For the second substrate treatment system 20, the above Step S4 to Step S7 are repeatedly performed, hut the offset amount calculated at the past Step S5 may be used for the calculation of the estimated feature amount at Step S4 in second and subsequent times.

As explained above, the substrate inspection method according to this embodiment includes: creating a correlation model indicating a relation between a pixel value in a captured image of a wafer W and a feature amount of a film formed on the wafer W, based on a measured result of a feature amount of a film formed on a model creating wafer W by a measuring instrument and on a model creating captured image generated by imaging the model creating wafer W by an imaging apparatus 210 in a first substrate treatment system 10; imaging a feature amount acquisition object wafer by an imaging apparatus 210 in a second substrate treatment system 20 to generate a captured image, and calculating an estimated feature amount of a film formed on the feature amount acquisition object wafer W, based on the captured image and on the correlation model; calculating a statistical value of the estimated feature amounts calculated for a plurality of the feature amount acquisition object wafers W; and calculating an offset amount for the estimated feature amount from a measured result by a measuring instrument of a feature amount of a film formed by performing a same treatment as a formation treatment of the film whose estimated feature amount has been calculated on an offset calculating wafer W in the second substrate treatment system 20, and from the statistical value of the estimated feature amounts. In other words, in the second substrate treatment system 20, the feature amount of a film formed on the feature amount acquisition object wafer W is calculated using the correlation model created based on the imaging result of the model creating wafer W by the imaging apparatus 210 in the first substrate treatment system 10. Therefore, the creation of the correlation model based on the imaging result of the model creating wafer W by the imaging apparatus 210 in the second substrate treatment system 20 is unnecessary. Accordingly, the feature amount can be easily calculated. Further, in this embodiment, the offset amount is calculated for the estimated feature amount calculated using the above correlation model in the second substrate treatment system 20 as explained above. Therefore, it is possible to correct the estimated feature amount using the offset amount and acquire an accurate feature amount.

In the above, in calculating the statistical value of the estimated feature amounts for calculating the offset amount for the estimated feature amount of each film, the calculated estimated feature amount is used for calculation of the statistical value irrespective of the value of the calculated estimated feature amount. Instead of this, the statistical value may be calculated after excluding the calculated estimated feature amount not in a predetermine range of the calculated estimated feature amounts. The predetermined range is a range, for example, except for the top 5% and the bottom 5% of the calculated estimated feature amounts.

Note that in the second substrate treatment system 20, a defect inspection for determining the presence or absence of a defect on the wafer W can be performed by the imaging controller 251 using the inspection apparatuses 145, 146, 147, 153, 154 in mass production. For example, based on the post-pattern formation captured image acquired from imaging result by the imaging apparatus 210 of the inspection apparatus 147, the presence or absence of a defect within the corresponding wafer W can be determined. Then, in calculating the statistical value of the estimated feature amounts, the estimated feature amount for the wafer W in which a defect has been detected in the defect inspection may be excluded. This can prevent the influence of the wafer W which originally has abnormality or the wafer W in which abnormality has occurred during treatment, thereby making it possible to calculate an appropriate offset amount and appropriately correct the treatment conditions in the second substrate treatment system 20.

Besides, in calculating the statistical value of the estimated feature amounts, the estimated feature amount for the wafer W whose pixel value in the initial state captured image in mass production is out of a predetermined range may be excluded. The predetermined range is, for example, within a range of ±30% of the in-plane average of the pixel values of the initial state captured image acquired in creating the correlation model. This can prevent the influence of the wafer W which originally has abnormality, thereby making it possible to calculate an appropriate offset amount and appropriately correct the treatment conditions in the second substrate treatment system 20.

Further, in the case where the offset amount calculated at Step S5 is out of a predetermined range, such a fact may be reported. The predetermined range is, for example, a range where the absolute value of the offset amount is equal to or less than a target feature amount. Making the report enables a user to recognize that the offset amount is abnormal. Besides, in the case where the offset amount calculated at Step S5 is out of a predetermined range, it is preferable not to apply the offset amount to the correction and of the estimated feature amount at Step S6 and the like. This makes it possible to perform appropriate correction of the treatment conditions and the like in the second substrate treatment system 20.

Note that the processing performed by the total controller 30 may be performed by the imaging controller 251 in the substrate treatment system 10, 20, and the processing performed by the imaging controller 251 in the substrate treatment system 10, 20 may be performed by the total controller 30.

The offset amount for the estimated feature amount is added in correcting the estimated feature amount in the above example, but, in this addition, the offset amount may be multiplied by a predetermined ratio that is equal to or less than 1 and then added. This can prevent large change in estimated feature amount between before and after the correction.

Note that the calculation of the offset amount for the estimated feature amount, the correction of the estimated feature amount based on the calculated offset amount and so on are performed only for the second substrate treatment system 20 in the above, but may be performed also for the first substrate treatment system 10.

Besides, the product wafer itself is measured to create the correlation model in the above example. The correlation model of the film thickness may be created using the film thickness of a bare wafer, which has been subjected to the coating and baking treatments on the same conditions as those at production, in place of the production wafer.

Note that for the line width, the correlation model may be created using a measured value measured after the next process (such as etching) of the production wafer and the line width after the next process may be estimated based on the correlation model.

Besides, the bare wafer is used as the offset wafer W in the above example, but the production wafer may be used.

The RGB data on the captured image is used as the pixel value relevant to the feature amount of a film in the above example, but the pixel value may be for all of R, G, B or may be for one color or two colors of them. Besides, the pixel value may be a pixel value of a color other than R, G, B.

The embodiments disclosed herein are only examples in all respects and should not be considered to be restrictive. The above embodiments may be abbreviated, replaced, or changed in various forms without departing from the scope and spirit of the attached claims.

Note that the following configurations also belong to the technical scope of this disclosure.

(1) A substrate inspection method of inspecting a substrate, including:

creating a correlation model indicating a relation between a pixel value in a captured image of the substrate and a feature amount of a film formed on the substrate, based on a measured result of a feature amount of a film formed on a model creating substrate by a measuring instrument and on a model creating captured image generated by imaging the model creating substrate by an imaging apparatus in a first substrate treatment system;

imaging a feature amount acquisition object substrate by an imaging apparatus in a second substrate treatment system to generate a captured image, and calculating an estimated feature amount of a film formed on the feature amount acquisition object substrate, based on the captured image and on the correlation model;

calculating a statistical value of the estimated feature amounts calculated for a plurality of the feature amount acquisition object substrates; and calculating an offset amount for the estimated feature amount from a measured result by a measuring instrument of a feature amount of a film formed by performing, on an offset calculating substrate in the second substrate treatment system, a same treatment as a formation treatment of the film whose estimated feature amount has been calculated and from the statistical value of the estimated feature amounts.

In the (1), in the second substrate treatment system, the feature amount of a film formed on the feature amount acquisition object wafer W is calculated using the correlation model created based on the imaging result of the model creating substrate by the imaging apparatus in the first substrate treatment system. Therefore, the creation of the correlation model based on the imaging result of the model creating substrate by the imaging apparatus in the second substrate treatment system is unnecessary. Accordingly, the feature amount can be easily calculated. Further, in the (1), the offset amount is calculated for the estimated feature amount calculated using the above correlation model in the second substrate treatment system as explained above. Therefore, it is possible to correct the estimated feature amount using the offset amount and acquire an accurate feature amount.

(2) The substrate inspection method according to the (1), further including correcting the estimated feature amount calculated at the calculating the estimated feature amount of the film, based on the offset amount.

(3) The substrate inspection method according to the (2), wherein the corrected estimated feature amount is used for adjusting a condition of a substrate treatment in the second substrate treatment system.

(4) The substrate inspection method according to any one of the (1) to (3), wherein the feature amount of the film is a film thickness or a line width of the film.

(5) The substrate inspection method according to any one of the (1) to (4), wherein the calculating the statistical value of the estimated feature amounts excludes the estimated feature amount not in a predetermined range from the estimated feature amount calculated at the calculating the estimated feature amount to calculate the statistical value.

(6) The substrate inspection method according to any one of the (1) to (5), wherein the calculating the statistical value of the estimated feature amounts excludes the estimated feature amount calculated at the calculating the estimated feature amount for the feature amount acquisition object substrate in which a defect has been detected in a defect inspection based on the captured image of the feature amount acquisition object substrate from the estimated feature amounts calculated at the calculating the estimated feature amount to calculate the statistical value.

(7) A substrate inspection system for inspecting a substrate, including:
first and second substrate treatment systems each including an imaging apparatus configured to image the substrate and a treatment apparatus configured to treat the substrate; and
a controller, the controller being configured to:
generate a model creating captured image from a result of imaging a model creating substrate by the imaging apparatus in the first substrate treatment system;
create a correlation model indicating a relation between a pixel value in a captured image of the substrate and a feature amount of a film formed on the substrate, based on a measured result of a feature amount of a film formed on the model creating substrate by a measuring instrument and on the model creating captured image;
image a feature amount acquisition object substrate by the imaging apparatus in the second substrate treatment system to generate a captured image, and calculate an estimated feature amount of a film formed on the feature amount acquisition object substrate, based on the captured image and on the correlation model;
calculate a statistical value of the estimated feature amounts calculated for a plurality of the feature amount acquisition object substrates; and
calculate an offset amount for the estimated feature amount from a measured result by a measuring instrument of a feature amount of a film formed by performing, on an offset calculating substrate in the second substrate treatment system a same treatment as a formation treatment of the film whose estimated feature amount has been calculated and from the statistical value of the estimated feature amounts.

(8) A control apparatus of a substrate inspection system for inspecting a substrate,
the substrate inspection system including first and second substrate treatment systems each including an imaging apparatus configured to image the substrate and a treatment apparatus configured to treat the substrate,
the control apparatus being configured to:
create a correlation model indicating a relation between a pixel value in a captured image of the substrate and a feature amount of a film formed on the substrate, based on a measured result of a feature amount of a film formed on a model creating substrate by a measuring instrument and on a model creating captured image generated by imaging the model creating substrate by the imaging apparatus in the first substrate treatment system;
calculate an offset amount for an estimated feature amount of a film formed on a feature amount acquisition object substrate, calculated based on a pixel value in a captured image generated by imaging the feature amount acquisition object substrate by the imaging apparatus in the second substrate treatment system and on the correlation model; and
in the calculating the offset amount, calculate the offset amount from a measured result by a measuring instrument of a feature amount of a film formed by performing, on an offset calculating substrate in the second substrate treatment system, a same treatment as a formation treatment of the film whose estimated feature amount has been calculated and from a statistical value of the estimated feature amounts calculated for a plurality of the feature amount acquisition object substrates.

According to this disclosure, it is possible to easily and accurately acquire a feature amount of a film formed on a substrate.

What is claimed is:

1. A substrate inspection method of inspecting a substrate, comprising:
creating a correlation model indicating a relation between a pixel value in a captured image of the substrate and a feature amount of a film formed on the substrate, based on a measured result of a feature amount of a film formed on a model creating substrate by a measuring instrument and on a model creating captured image generated by imaging the model creating substrate by an imaging apparatus in a first substrate treatment system;
imaging a feature amount acquisition object substrate by an imaging apparatus in a second substrate treatment system to generate a captured image, and calculating an estimated feature amount of a film formed on the feature amount acquisition object substrate, based on the captured image and on the correlation model;
calculating a statistical value of the estimated feature amounts calculated for a plurality of the feature amount acquisition object substrates; and
calculating an offset amount for the estimated feature amount from a measured result by a measuring instrument of a feature amount of a film formed by performing, on an offset calculating substrate in the second substrate treatment system, a same treatment as a formation treatment of the film whose estimated feature amount has been calculated and from the statistical value of the estimated feature amounts.

2. The substrate inspection method according to claim 1, further comprising correcting the estimated feature amount calculated at the calculating the estimated feature amount of the film, based on the offset amount.

3. The substrate inspection method according to claim 2, wherein the corrected estimated feature amount is used for adjusting a condition of a substrate treatment in the second substrate treatment system.

4. The substrate inspection method according to claim 3, wherein the feature amount of the film is a film thickness or a line width of the film.

5. The substrate inspection method according to claim 3, wherein the calculating the statistical value of the estimated feature amounts excludes the estimated feature amount not in a predetermined range from the estimated feature amount calculated at the calculating the estimated feature amount to calculate the statistical value.

6. The substrate inspection method according to claim 3, wherein the calculating the statistical value of the estimated feature amounts excludes the estimated feature amount calculated at the calculating the estimated feature amount for the feature amount acquisition object substrate in which a defect has been detected in a defect inspection based on the captured image of the feature amount acquisition object substrate from the estimated feature amounts calculated at the calculating the estimated feature amount to calculate the statistical value.

7. The substrate inspection method according to claim 2, wherein the feature amount of the film is a film thickness or a line width of the film.

8. The substrate inspection method according to claim 2, wherein the calculating the statistical value of the estimated feature amounts excludes the estimated feature amount not in a predetermined range from the estimated feature amount calculated at the calculating the estimated feature amount to calculate the statistical value.

9. The substrate inspection method according to claim 2, wherein the calculating the statistical value of the estimated feature amounts excludes the estimated feature amount calculated at the calculating the estimated feature amount for the feature amount acquisition object substrate in which a defect has been detected in a defect inspection based on the captured image of the feature amount acquisition object substrate from the estimated feature amounts calculated at the calculating the estimated feature amount to calculate the statistical value.

10. The substrate inspection method according to claim 1, wherein the feature amount of the film is a film thickness or a line width of the film.

11. The substrate inspection method according to claim 1, wherein the calculating the statistical value of the estimated feature amounts excludes the estimated feature amount not in a predetermined range from the estimated feature amount calculated at the calculating the estimated feature amount to calculate the statistical value.

12. The substrate inspection method according to claim 1, wherein the calculating the statistical value of the estimated feature amounts excludes the estimated feature amount calculated at the calculating the estimated feature amount for the feature amount acquisition object substrate in which a defect has been detected in a defect inspection based on the captured image of the feature amount acquisition object substrate from the estimated feature amounts calculated at the calculating the estimated feature amount to calculate the statistical value.

13. A substrate inspection system for inspecting a substrate, comprising:
   first and second substrate treatment systems each comprising an imaging apparatus configured to image the substrate and a treatment apparatus configured to treat the substrate; and
   a controller, the controller being configured to:
   generate a model creating captured image from a result of imaging a model creating substrate by the imaging apparatus in the first substrate treatment system;
   create a correlation model indicating a relation between a pixel value in a captured image of the substrate and a feature amount of a film formed on the substrate, based on a measured result of a feature amount of a film formed on the model creating substrate by a measuring instrument and on the model creating captured image;
   image a feature amount acquisition object substrate by the imaging apparatus in the second substrate treatment system to generate a captured image, and calculate an estimated feature amount of a film formed on the feature amount acquisition object substrate, based on the captured image and on the correlation model;
   calculate a statistical value of the estimated feature amounts calculated for a plurality of the feature amount acquisition object substrates; and
   calculate an offset amount for the estimated feature amount from a measured result by a measuring instrument of a feature amount of a film formed by performing, on an offset calculating substrate in the second substrate treatment system, a same treatment as a formation treatment of the film whose estimated feature amount has been calculated and from the statistical value of the estimated feature amounts.

14. A control apparatus of a substrate inspection system for inspecting a substrate,
   the substrate inspection system comprising first and second substrate treatment systems each comprising an imaging apparatus configured to image the substrate and a treatment apparatus configured to treat the substrate,
   the control apparatus being configured to:
   create a correlation model indicating a relation between a pixel value in a captured image of the substrate and a feature amount of a film formed on the substrate, based on a measured result of a feature amount of a film formed on a model creating substrate by a measuring instrument and on a model creating captured image generated by imaging the model creating substrate by the imaging apparatus in the first substrate treatment system;
   calculate an offset amount for an estimated feature amount of a film formed on a feature amount acquisition object substrate, calculated based on a pixel value in a captured image generated by imaging the feature amount acquisition object substrate by the imaging apparatus in the second substrate treatment system and on the correlation model; and
   in the calculating the offset amount, calculate the offset amount from a measured result by a measuring instrument of a feature amount of a film formed by performing, on an offset calculating substrate in the second substrate treatment system, a same treatment as a formation treatment of the film whose estimated feature amount has been calculated and from a statistical value of the estimated feature amounts calculated for a plurality of the feature amount acquisition object substrates.

* * * * *